(12) United States Patent
Stone

(10) Patent No.: US 9,349,549 B2
(45) Date of Patent: May 24, 2016

(54) ELECTRONIC COMPONENT

(75) Inventor: Kate Stone, Cambridge (GB)

(73) Assignee: Novalia Ltd., Cambridge (GB)

( * ) Notice: Subject to any disclaimer, the term of this patent is extended or adjusted under 35 U.S.C. 154(b) by 219 days.

(21) Appl. No.: 13/982,065

(22) PCT Filed: Jan. 27, 2012

(86) PCT No.: PCT/GB2012/050169
§ 371 (c)(1),
(2), (4) Date: Sep. 12, 2013

(87) PCT Pub. No.: WO2012/101446
PCT Pub. Date: Aug. 2, 2012

(65) Prior Publication Data
US 2013/0341173 A1  Dec. 26, 2013

(30) Foreign Application Priority Data
Jan. 28, 2011 (GB) .................................. 1101506.2

(51) Int. Cl.
*H01H 13/52* (2006.01)
*H01H 13/79* (2006.01)
*H05K 1/02* (2006.01)
*H05K 1/11* (2006.01)
(Continued)

(52) U.S. Cl.
CPC ............ *H01H 13/52* (2013.01); *H01H 13/7006* (2013.01); *H01H 13/79* (2013.01); *H05K 1/0293* (2013.01); *H05K 1/118* (2013.01); *H05K 1/16* (2013.01); *H01H 2203/02* (2013.01); *H01H 2203/022* (2013.01); *H05K 1/0386* (2013.01); *H05K 1/0393* (2013.01); *H05K 1/092* (2013.01); *H05K 2201/0385* (2013.01); *H05K 2201/09063* (2013.01); *H05K 2201/09263* (2013.01); *H05K 2201/10053* (2013.01)

(58) Field of Classification Search
CPC ....... H01H 13/79; H01H 13/52; H01H 13/70; H01G 5/01
USPC .......................... 200/512, 520, 5 A, 329, 341
See application file for complete search history.

(56) References Cited

U.S. PATENT DOCUMENTS 3,952,174 A * 4/1976 Boulanger et al. ............ 200/5 A
4,287,394 A * 9/1981 Hargita et al. ................ 200/5 A
(Continued)

FOREIGN PATENT DOCUMENTS

DE   4312672 A   10/1994
EP   0240791 A2  10/1987
(Continued)

OTHER PUBLICATIONS

GB Search Report dated May 18, 2011, GB Patent Application No. 1101506.2 (2 pages).
(Continued)

*Primary Examiner* — Edwin A. Leon
*Assistant Examiner* — Iman Malakooti
(74) *Attorney, Agent, or Firm* — Ware, Fressola, Maguire & Barber LLP

(57) ABSTRACT

An electronic component comprises a flexible planar substrate which is substantially non-stretchable, the substrate having at least two slits arranged to allow first and second portions of the substrate lying in the same plane to be moved apart, the first portion of the substrate supporting a region of conductive material.

16 Claims, 6 Drawing Sheets

(51) Int. Cl.
   *H01H 13/70* (2006.01)
   *H05K 1/16* (2006.01)
   *H05K 1/03* (2006.01)
   *H05K 1/09* (2006.01)

(56) References Cited

U.S. PATENT DOCUMENTS

| | | | |
|---|---|---|---|
| 4,338,502 A | 7/1982 | Hashimoto et al. | |
| 4,503,294 A | 3/1985 | Matsumaru | |
| 4,640,994 A | 2/1987 | Komaki | |
| 4,736,076 A | 4/1988 | Mochizuki et al. | |
| 4,847,452 A | 7/1989 | Inaba | |
| 6,011,227 A * | 1/2000 | Yoneyama | 200/344 |
| 2001/0032779 A1 | 10/2001 | Davidson et al. | |
| 2003/0173201 A1 | 9/2003 | Ohashi | |
| 2007/0171278 A1 * | 7/2007 | Chen | 348/61 |

FOREIGN PATENT DOCUMENTS

| | | | |
|---|---|---|---|
| EP | 0441993 A1 | 8/1991 | |
| GB | 2034102 A | 5/1980 | |
| GB | 2133218 A | 7/1984 | |
| GB | 2347647 * | 9/2000 | B42D 3/123 |
| GB | 2464537 A | 4/2010 | |
| JP | 06-140727 A | 5/1994 | |
| JP | 09-205257 A | 8/1997 | |
| WO | 2004/077286 A1 | 9/2004 | |
| WO | 2007/035115 A1 | 3/2007 | |

OTHER PUBLICATIONS

English Abstract, JP Publication No. 09-205257, published Aug. 5, 1997, Toshiba Corp. (1 page).
Patent Abstracts of Japan, English Abstract, JP Publication No. 06-140727, published May 20, 1994, Sumitomo Wiring Systems Ltd. (1 page).
International Search Report, International application No. PCT/GB2012/050169, mailed Apr. 4, 2012 (4 pages).
English Abstract, DE4312672A, published Oct. 20, 1994, (2 pages).
Written Opinion of the International Searching Authority, International application No. PCT/GB2012/050169, mailed Apr. 4, 2012 (6 pages).

* cited by examiner

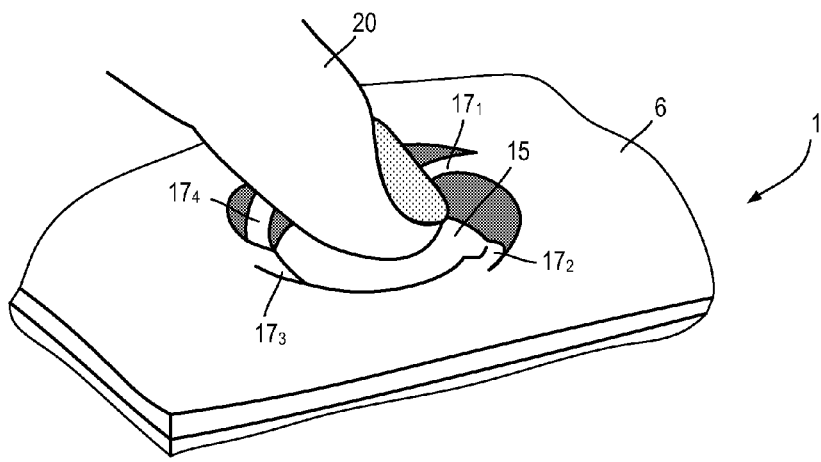
Fig. 2
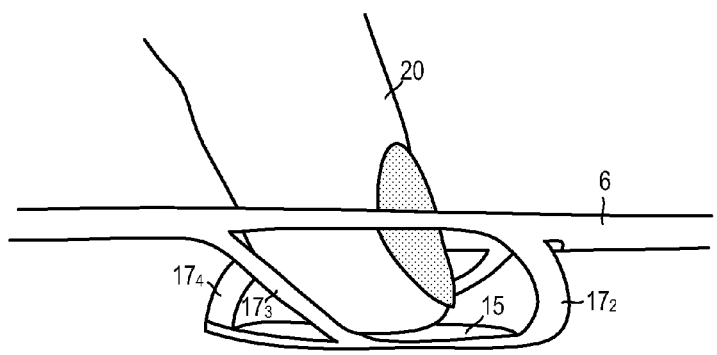
Fig. 3
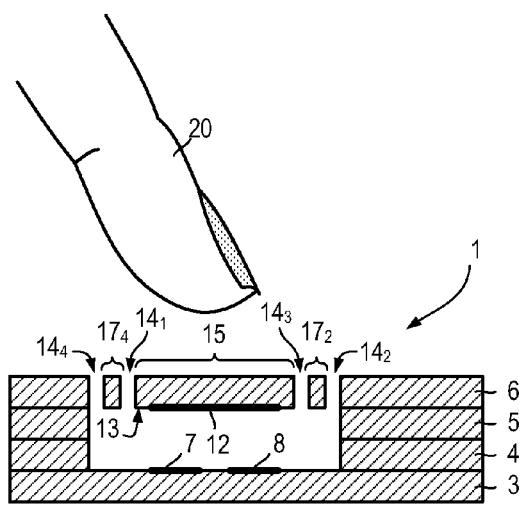 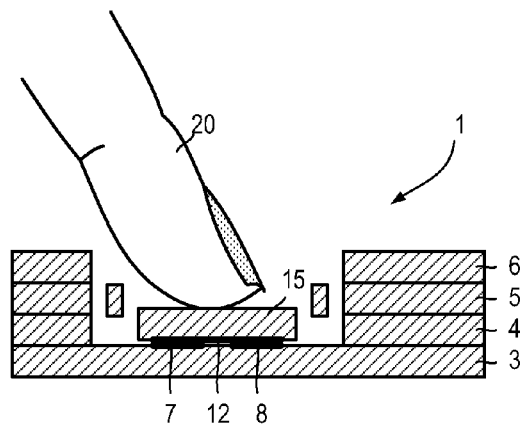
Fig. 4a                    Fig. 4b

ELECTRONIC COMPONENT

FIELD OF THE INVENTION

The present invention relates to an electronic component.

BACKGROUND

Electronic components are increasingly being incorporated into printed articles, such as books, posters and greeting cards, to allow printed articles to become more interactive. Examples of interactive printed articles are described in GB 2 464 537 A, WO 2004 077286 A, WO 2007 035115 A and DE 1993 4312672 A.

SUMMARY

The present invention seeks to facilitate incorporation of electronic components, such as switches and connectors, into articles, for instance games, books, greeting cards, product packaging and posters.

According to a first aspect of the present invention there is provided an electronic component comprising a flexible planar substrate which is substantially non-stretchable, the substrate having at least two slits arranged to allow first and second portions of the substrate lying in the same plane to be moved apart, the first portion of the substrate supporting a region of conductive material.

Thus, substrates such as paper, card and plastic can be adapted so that they can be deformed or stretched and be used in switches, connectors and other forms of electronic component.

A group of slits may be arranged to allow the first portion of the substrate to move out of the plane of the substrate. This can allow the substrate to form the moving part of a switch or another type of electronic component.

There may be three, four, five or six slits. There may be between 6 and 12 slits. There may be between 12 and 24 slits. There may be between 24 and 36 slits. There may be more than 36 slits.

The group of slits may comprise at least three slits arranged around the first portion of the substrate. The slits may be arcuate. Each slit may overlap with an adjacent slit to form a bridge between the slits between the first portion of the substrate and the rest of the substrate.

There may be three, four, five or six bridges. There may be between 6 and 12 bridges. There may be between 12 and 24 bridges. There may be between 24 and 36 bridges. There may be more than 36 bridges.

The region of conductive material may comprise a pad of conductive material lying within the extent of the first portion of the substrate. The pad of conductive material may be isolated. The region of conductive material may further comprise a conductive track connected to the pad of conductive material extending beyond the first portion of the substrate.

The region of conductive material may be a first region of conductive material and the electrical element may further comprise a second substrate supporting a second region of conductive material arranged to face the first region of conductive material and separated by a given distance such that displacement of the first portion of the substrate by the given distance causes the first and second conductive regions to come into contact. The second substrate may further include a third region of conductive material spaced apart from the second conductive region, and the second and third conductive regions may arranged to face and overlap with the first conductive region such that displacement of the first portion of the substrate by the given distance causes the second and third conductive regions to be connected.

The slits may be arranged to allow the first and second portions of the substrate to be moved apart in the same plane. This can allow the substrate to form a stretchable connector or other form of electronic component.

The substrate may comprise first and second opposite edges and wherein at least one slit extends from each opposite edge. The substrate may have a line running midway between the opposite edges and wherein at least one slit crosses the midway line. The substrate may comprise at least one slit which extends between but does not reach the opposite edges. The slits may be parallel. The region of conductive material may comprise at least one track which runs between the slits.

The substrate may comprise a fibre-based material, such as paper or card. The substrate may comprise plastic or polymer, such as polyethylene terephthalate (PET). The substrate may comprise a laminate. The substrate may comprise an insulating material.

The substrate may have a thickness of at least 5 µm, at least 10 µm, at least 20 µm, at least 50 µm, at least 100 µm, at least 200 µm or at least 500 µm.

The conductive material may comprise a conductive ink. The conductive ink may be a carbon-based ink. The conductive ink may be a metal-based conductive ink, such as a silver- or copper-based conductive ink.

The conductive material may be a polymer.

The conductive material may be metal foil comprising, for example, aluminium, copper, gold or silver. The substrate may comprise a metallized polymer, such as metallized PET.

The electronic component may be a passive component or an active component, such as a transistor. The electronic component may be a sensor, such as a microphone, or an actuator.

According to a second aspect of the present invention there is provided an article comprising an electrical circuit and at least one of the electronic components, wherein the region of conductive material forms part of the electrical circuit.

The article may be a game, book, poster, product packaging, calendar, greeting cards or point of sale display.

BRIEF DESCRIPTION OF THE DRAWINGS

Certain embodiments of the present invention will now be described, by way of example, with reference to the accompanying drawings, in which:

FIG. 2 is a perspective view showing the top of the push button switch shown in FIG. 1 when pressed by a user;

FIG. 3 is a side view showing the top of the push button switch shown in FIG. 1 when pressed by a user;

FIG. 4a is a cross section of the push button switch shown in FIG. 1 in a first, released position;

FIG. 4b is a cross section of the push button switch shown in FIG. 1 in a second, depressed position;

DETAILED DESCRIPTION OF CERTAIN EMBODIMENTS

Figure 1:
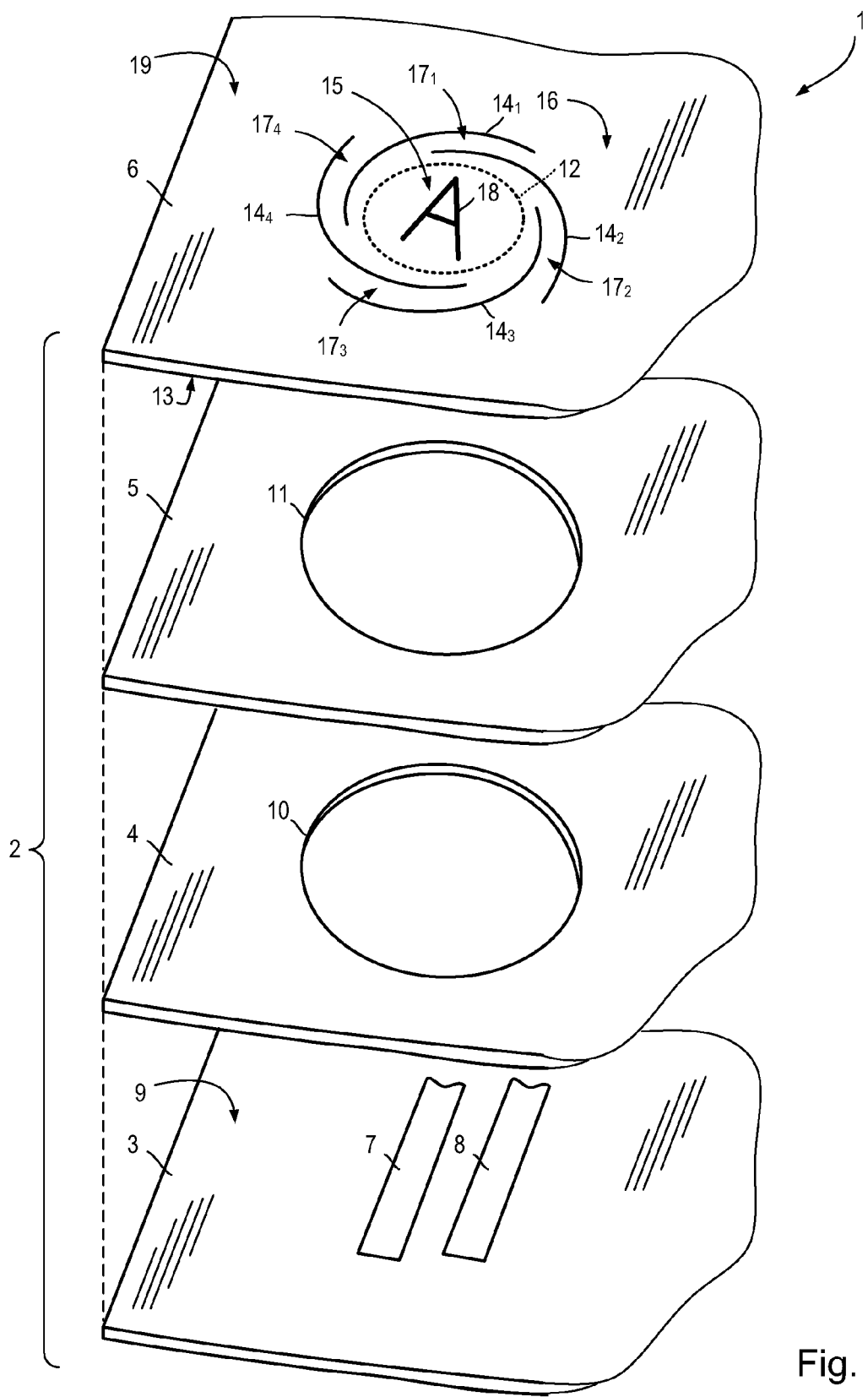
FIG. 1 is an exploded perspective view of a first push button switch in accordance with the present invention.

A push button switch can be made from a laminate comprising a stack of sheets of card.

For example, a switch (not shown) can be made by printing two tracks of conductive ink on an upper face of a first sheet of card (not shown), placing a second sheet of card (not shown) having a window cut out from it on top of the first sheet so that the window is aligned over the tracks and placing a third sheet of card (not shown) on top of the second sheet of card, the third sheet having a pad of conductive ink printed on a lower face.

The two tracks of conductive ink on the first sheet serve as terminals of the switch and the pad of conductive ink on the third sheet provides a contact plate. The second sheet acts as a spacer element forming an air gap separating the contact plate and the tracks.

If downward pressure is applied to the upper face of the third sheet, the pad of conductive ink is pressed against the two tracks, thereby closing the switch.

This type of switch suffers several drawbacks.

Firstly, the switch may require significant pressure to be applied to close it, particularly if the window in the spacer layer is small and/or the air gap is large.

Secondly, if too much pressure is applied to the card, the card (or some other part of the laminate) may tear thereby irreversibly damaging the switch. Even if the card does not tear, it may be permanently deformed and may not return to its original position when pressure is released. In either case, this may result in the switch being permanent closed.

These drawbacks generally stem from the fact that card is inelastic and, although flexible, is unable to stretch in plane. These drawbacks affect not only switches made from card, but also switches made from other inelastic materials which generally cannot stretch, but which may be able bend out of the plane, such as paper, plastic and even thin sheets of glass.

Furthermore, the property that card is unable to stretch can restrict the use of card as substrates in other forms of electronic component, particularly if the substrate is under strain.

These problems may be addressed by cutting card as will now be described in more detail.

Referring to FIGS. 1 to 3, 4a and 4b, a first push button switch 1 in accordance with the present invention is shown.

The push button switch 1 is formed in a laminate 2 comprising a plurality of sheets 3, 4, 5, 6 of card. The sheets of card 3, 4, 5, 6 have the same thickness and in this example have a weight of about 200 $gm^{-2}$. However, card or board having a greater weight, for example up to 350 $gm^{-2}$ or more, can be used. However, the sheets need not all have the same thickness and can have different weights. The sheets 3, 4, 5, 6 are held together with an adhesive (not shown).

Tracks 7, 8 of conductive material, in this case conductive ink, are disposed on an upper surface 9 of a first sheet 3 (herein also referred to as the "bottom sheet"). A metal-based conductive ink, such as silver- or copper-based conductive ink, can be used. In some cases, a conductive polymer can be used. Second and third sheets 4, 5 (herein also referred to as "intermediate" sheets or "spacer" sheets) are stacked on the first sheet 3. One intermediate sheet or more than two intermediate sheets may be used. The intermediate sheets 4, 5 each have apertures 10, 11. In this example, the apertures 10, 11 are circular and are coextensive. The apertures 10, 11 are aligned with the conductive tracks 7, 8 such that sections of both tracks 7, 8 appear through the windows 10, 11.

A fourth sheet 6 (herein also referred to as the "top sheet") is stacked on the uppermost intermediate sheet, in this case the third sheet 5. A region 12 of the conductive material, in this example of conductive ink, is disposed on a lower surface 13 of the sheet 6. A metal-based conductive ink, such as silver- or copper-based conductive ink can be used. In some cases, a conductive polymer can be used. In this case, the region 12 is a circular pad. The pad 12 is aligned with the windows 10, 11 and the tracks 7, 8.

The top sheet 6 includes four arcuate slits $14_1, 14_2, 14_3, 14_4$ arranged around a first, generally disc-shaped portion 15 of the sheet 6 (herein also referred to as a "button"). The slits $14_1, 14_2, 14_3, 14_4$ separate the button 15 from a second, surrounding region 16 of the sheet 6. The first and second regions 15, 16 are joined by thin bridges $17_1, 17_2, 17_3, 17_4$ of card material.

The top sheet 6 may also support printed indicia 18, for example, text and/or images, on an upper surface 19.

The button 15 is generally large enough to be pressed by a finger 20 of a user. The button has a width (in this case, diameter) in a range of about 10 to 20 mm, for example around 15 mm. However, the button 15 can be larger, for example having a width more than 10 mm, more than 20 mm, more than 50 mm or even more than 100 mm. Larger buttons can be used which are intended to be pressed by two or more fingers, by a hand or even by a foot or other part of the body. However, in some applications, the button need not be designed to be pressed by a user. For example, the switch may form part of machine and may be actuated by a rod or other member. In some examples, the button 15 can be smaller, for example having a width (or diameter) of less than 10 mm.

The slits $14_1, 14_2, 14_3, 14_4$ allow the button 15 to move perpendicularly to the top sheet 6, for example downward. As the button 15 moves, it gently rotates. Furthermore, when pressure is applied to the button 15 and is displaced, the bridges $17_1, 17_2, 17_3, 17_4$ exert a spring force such that when the pressure is released, the button 15 returns to its original position, as shown in FIG. 4a.

As shown in FIGS. 2 and 3, a user can press the button 15 down using their finger 20.

As shown in FIG. 4b, if the user presses the button 15 with their finger 20, the conductive pad 12 is brought into contact with the underlying tracks 7, 8, thereby closing the switch 1.

Less pressure is used to operate the switch 1 compared with the pressure needed to operate a similar switch without slits. Furthermore, if the button 15 is not displaced beyond the length of the bridges $17_1, 17_2, 17_3, 17_4$, pressing the button 15 does not rip, tear or permanently deform the top sheet 6. Thus, the switch 1 can be repeatedly used, providing reliable operation.

The button 15 may be displaced by at least the thickness of the sheet so that it is completely out of the plane of the sheet 6. It may be possible to displace the button tens, hundreds or more times the thickness of the sheet 6.

The spring force can be increased by using thicker or stiffer card (or other suitable material).

Figure 5:
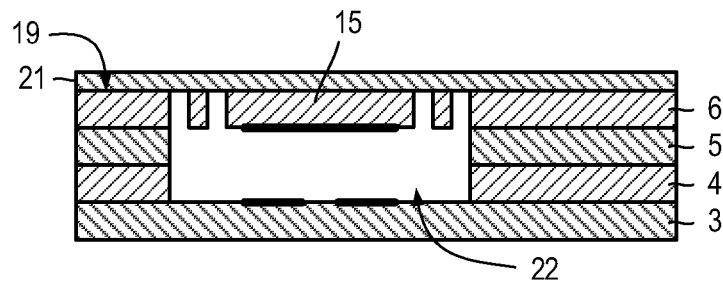
FIG. 5 is a cross section of the push button switch shown in FIG. 1 having a protective layer.

Referring to FIG. 5, spring force can also be increased attaching a continuous elastic membrane 21 to the upper surface 19 of the top sheet 6.

The membrane 21 can help protect the switch 1, for example, by preventing the ingress of water and dirt into the cavity 22 under the button 15. In some embodiments, if increased spring force is not required, then the membrane 21 need not be attached to the top of the button 15. The membrane 21 may be transparent and, thus, allow indicia 18 printed on the upper surface 19 of the top sheet 6 to be seen. Alternatively, the membrane 21 may be opaque and may itself support indicia.

Figure 6:
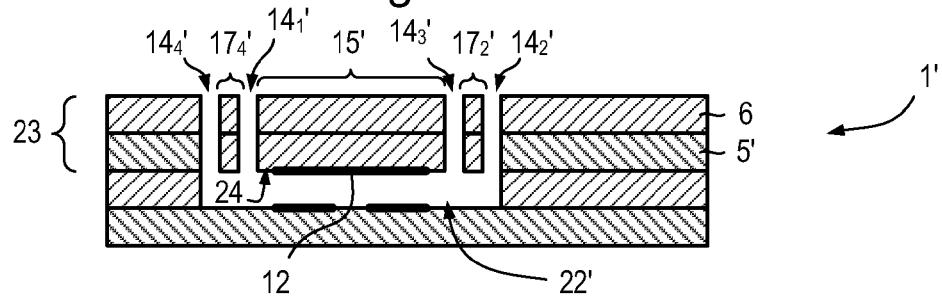
FIG. 6 is a cross section of a second push button switch.

Referring to FIG. 6, a second push button switch 1' is shown.

The second push button switch 1' is similar to the first button switch 1 (FIGS. 1 & 4a) except that the fourth sheet 6 is laminated with one or more underlying (or overlying) sheets, in this case a third sheet 5', to form a set of laminated sheets 23 (herein referred to as a "top laminate sheet"). The third sheet 5' differs from the third sheet 5 (FIGS. 1 & 4a) of the first button switch 1 (FIGS. 1 & 4a) in that it does not have a window and is not used to provide a spacer layer, and also that it is patterned in the same way as the fourth sheet 6. Furthermore, the conductive pad 12 is disposed on a lower face 24 of the third sheet 5'.

The top laminated sheet 23 is patterned with deeper slits $14_1'$, $14_2'$, $14_3'$, $14_4'$ to form thicker bridges $17_2'$, $17_4'$. Using two or more sheets to make a top laminate sheet 23 makes the bridges $17_2'$, $17_4'$ thicker, thereby increasing the return force.

Furthermore, if fewer intermediate sheets are used, then the air gap 22' becomes smaller. Thus, the button 15' does not need to be displaced so far to close the switch 1', i.e. a shorter length of travel.

In some embodiments, the third sheet 5' is the same as the third sheet 5 (FIGS. 1 & 4a) of the first button switch 1 (FIGS. 1 & 4a) and an additional, fifth sheet (not shown) is provided which is glued to the fourth sheet 6 to provide a top laminate sheet 23. This can be used to make a stiffer push button switch compared to the first button switch 1 (FIGS. 1 & 4a), but one which has the same length of travel.

In the push button switches described earlier, the conductive pad on the button is electrically isolated and simply serves as a contact plate to connect terminals located under the button. However, the conductive pad can be a terminal itself and co-operate with a corresponding terminal located under the button.

Figure 7:
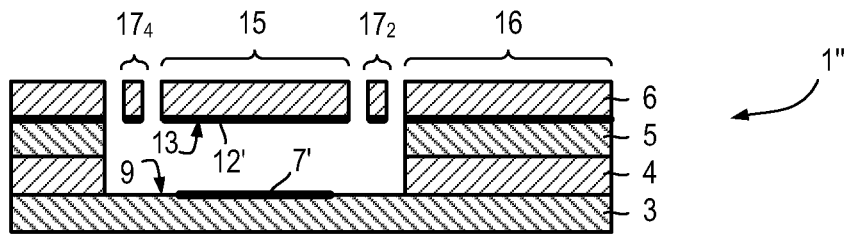
FIG. 7 is a cross section of a third push button switch.

Referring to FIG. 7, a third push button switch 1" is shown.

The third push button switch 1" is similar to the first button switch 1 (FIGS. 1 & 4a) except that there is only one track 7' on the upper surface 9 of the first sheet 3 and a conductive pad 12' is arranged on the lower surface 13 of the top sheet 6 which extends under the button 15 and the bridges $17_2$, $17_4$ and runs as a track under part of the surrounding region 16 of the sheet 6.

In the push button switches described earlier, the slits take the form of arcuate line cut in card. However, the slits need not be smooth arcs, but can be formed from a series of two or more straight lines joined by one or more sharp turns. For example, a slit may take the form of two lines joined by a right-angle turn to form an 'L'-shape. The slits need not simply be narrow cuts in card, but may take the form of slots where material from the card is removed, for example having a width of at least 0.2 mm, at least 0.5 mm, at least 1 mm, at least 2 mm or at least 5 mm.

Slits may turn through more than 90°, for example through an angle of 120° or more or through an angle of 180° or more. Two or more slits can form interlocking spirals. Alternatively, a set of slits may be nested within another set of slits. These arrangements generally have the effect of reducing the spring force of the button.

Figure 8:
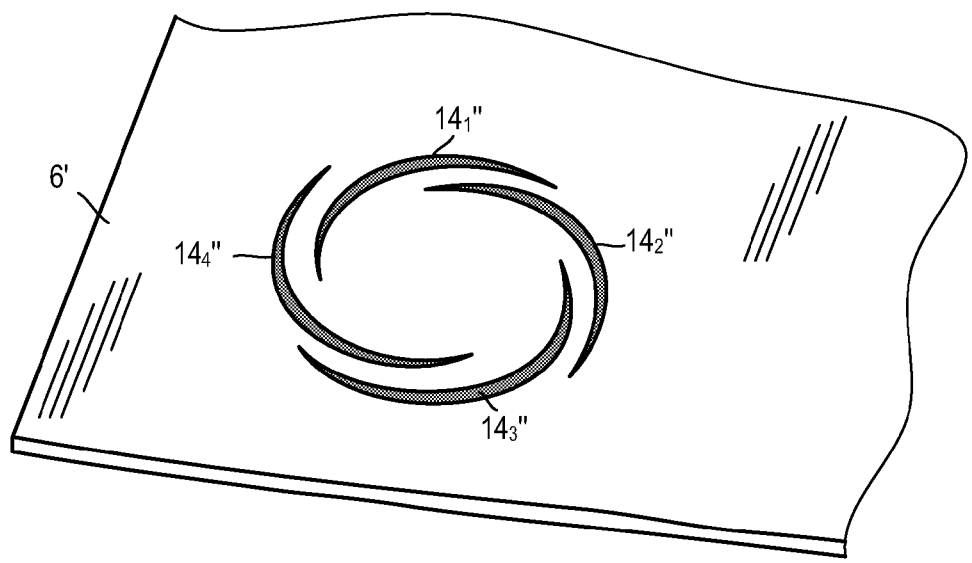
FIG. 8 is a perspective view showing a push button switch using slits having a different shape.

Referring to FIG. 8, a top sheet 6' is shown in which the slits $14_1''$, $14_2''$, $14_3''$, $14_4''$ are crescent-shaped. Having smooth ends to the slits $14_1''$, $14_2''$, $14_3''$, $14_4''$ can help to avoid tearing.

The button need not be circular, but can be oval, square, rectangular, polygonal (regular with sides the same length or irregular with sides of two or more lengths) or even be an irregular shape.

Figure 9:
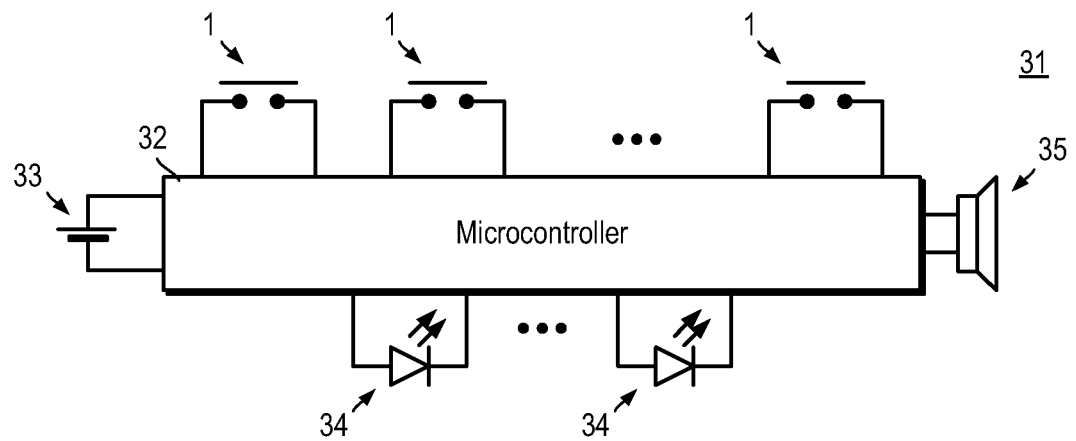
FIG. 9 is a schematic diagram of circuitry in which one or more push button switches in accordance with the present invention can be used.

A switch in accordance with the present invention can be used to provide user input, as will now be described:

Referring to FIG. 9, a device 31 is shown which comprises a microcontroller 32 and a battery 33. The device 31 includes one or more switches 1 and one or more sets of output devices 34, 35, such as one or more light emitting diodes 34 and a piezoelectric speaker 35. The user can provide input via the switches 1 in response to which the microcontroller 32 provides output signals via the output devices 34, 35.

Figure 10:
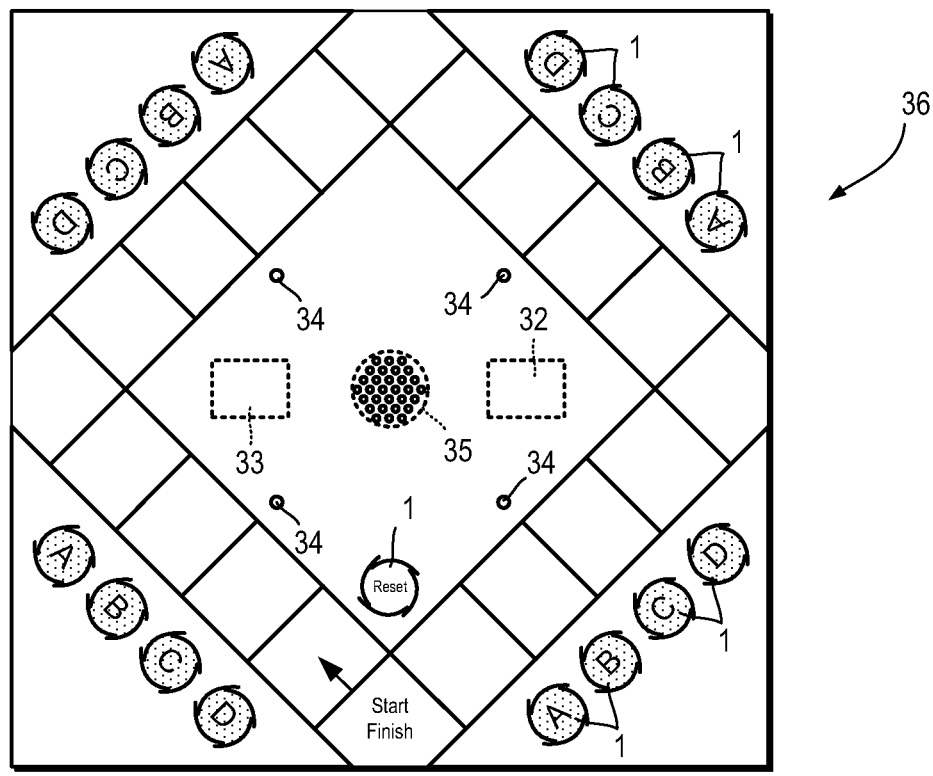
FIG. 10 is a plan view of a game in which one or more push button switches in accordance with the present invention can be used.

Referring also to FIG. 10, the device 31 may be incorporated into a board game or other printed article, such as a greeting card, product packaging (for example, secondary packaging), book, poster or point of sale display.

As shown in FIG. 10, the board game 36 includes push button switches 1. The microcontroller 32 reads out questions and/or answers to questions via the speaker 35. Players may enter answers, for example by choosing one of four answers, via a set of switches 1. The correct answer and/or quickest answers may be acknowledged using light emitting diodes 34.

Other switches in accordance with the present invention, such as the second switch 1' (FIG. 6) or third switch 1" (FIG. 7), can be used instead of the first switch 1.

As explained earlier, the property that card is unable to stretch can restrict the use of card as a substrate material, particularly if under strain. However, if card or paper can be used as a substrate, for example, to provide a connector or other forms of electric or electronic component, then this can simplify the manufacture of devices using printing and/or converting processes. For example, push switches or capacitive sensing switches may be integrated into one part of product packaging and a circuit board may be supported by another, different part of the product packaging. If a card- of paper-based connector is used to connect the switches to the circuit board using conductive glue or conductive tape, then a conventional converting plant (or at least one which needs minimal modification) can be used to assemble interactive printed media.

Figure 11:
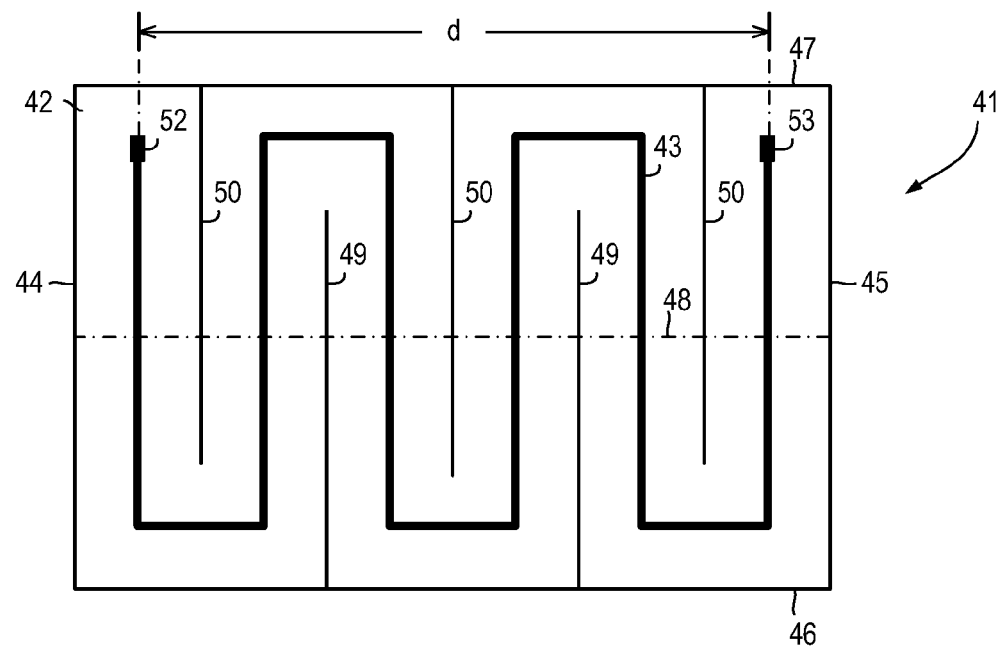
FIG. 11 is a plan view of a first connector in accordance with the present invention.

Referring to FIG. 11, a first connector 41 in accordance with the present invention is shown.

The connector 41 comprises a sheet 42 of paper or card. The sheet 42 supports a region 43 of conductive material, in this case, an elongate track of conductive ink.

The sheet 42 is generally rectangular, extends between first and second ends 44, 45 and has first and second opposite edges 46, 47. The sheet 42 has a centre line 48 running from the first to the second ends 44, 45 between the edges 46, 47 of the sheet.

A series of interdigitated slits 49, 50 extend from each edge 46, 47 crossing the centre line 48, but not reaching the opposite edge 46, 47. The slits 49, 50 may take the form of slots, e.g. having a width of at least 1 mm, at least 2 mm, at least 5 mm, at least 10 mm or at least 20 mm.

The track 43 runs a long a path defined by the slits 49, 50, generally in a zigzag, between ends or terminals 52, 53. The terminals 52, 53 are separated by a distance, d.

When the sheet is laid flat, the distance, d, between the terminals 52, 53 cannot be increased without the slits 49, 50.

Figure 12:
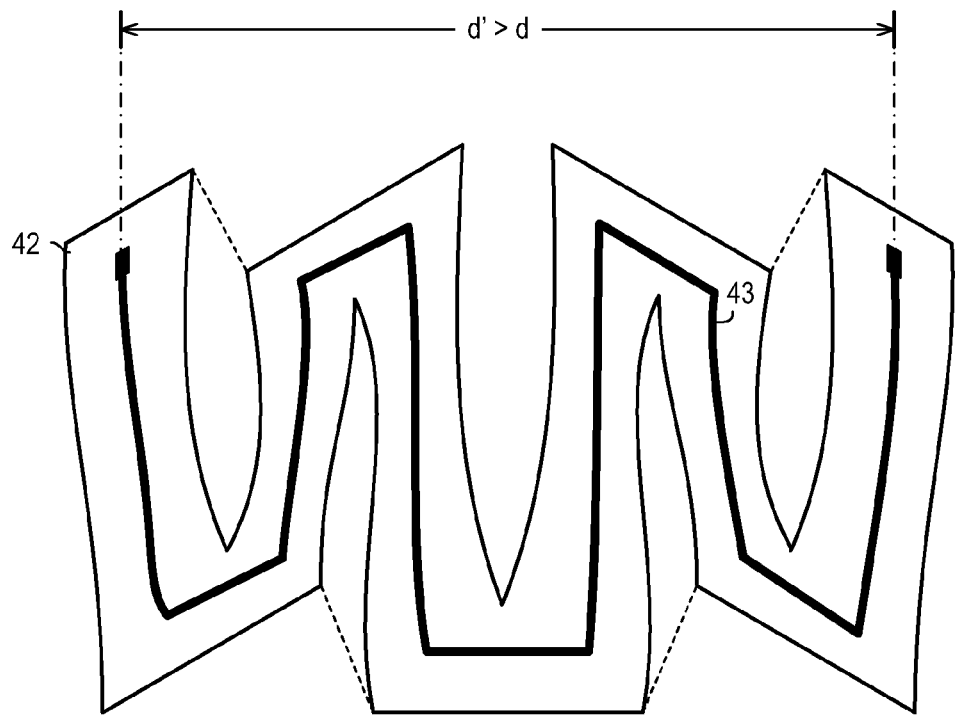
FIG. 12 is a perspective view showing the connector shown in FIG. 11 when stretched.

Referring also to FIG. 12, by including the slits 49, 50, the ends 44, 45 of the sheet can be pulled apart. The extended sheet has a paper garland-like appearance.

The slits 49, 50 allow different parts of the sheet 42 to twist in different directions and increases the freedom with which the terminals 52, 53 can move with respect to each other. In particular, the separation between the terminals 52, 53 can increase to a distance, d', where d'>d. Furthermore, the orientation of the terminals 52, 53 can vary relative to each other allowing the sheet 42 to turn and stretch.

Figure 13:
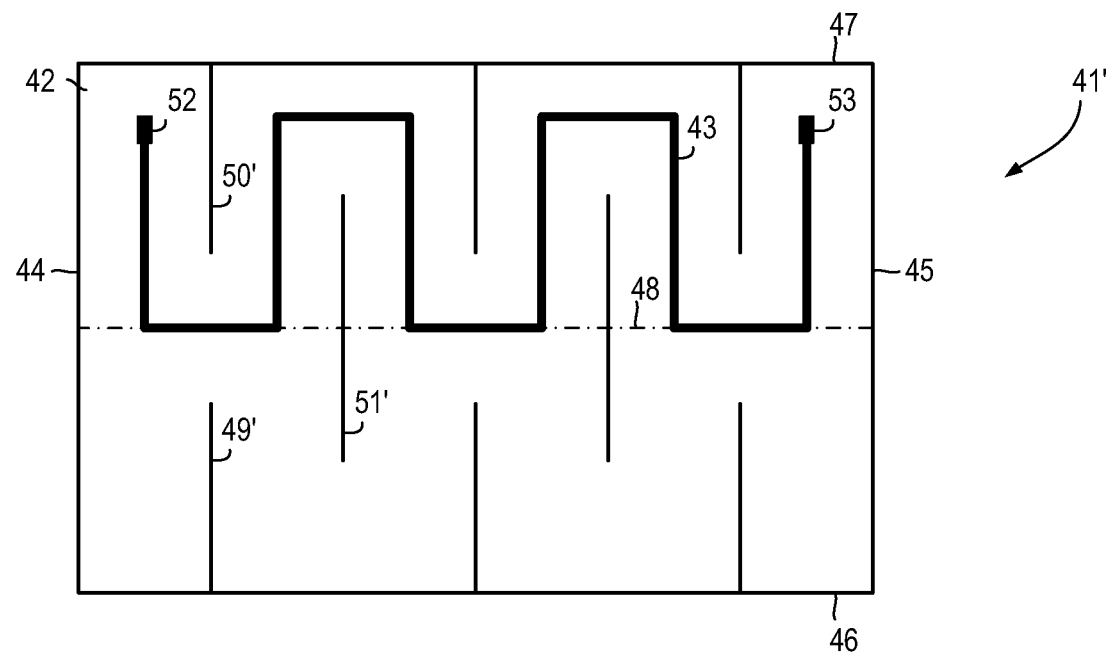
FIG. 13 is a plan view of a second connector in accordance with the present invention.

Referring to FIG. 13, a second connector 41' in accordance with the present invention is shown.

The connector 41' is similar to the first connector 41 (FIG. 11). However, a set of slits 49', 50', 51' having a different configuration is used. The slits 49', 50', 51' include pairs of opposing slits 49', 50' extending from opposite edges 46, 47 interposed with central transverse slits 51'. The pairs of opposing slits 49', 50' do not cross the central line 48 and do not meet.

The slits take the form of straight cuts. However, the slits can be curved. Moreover, the slits may include slots, e.g. having a width of at least 1 mm, at least 2 mm, at least 5 mm, at least 10 mm or at least 20 mm.

A connector may include multiple tracks, for example, running parallel. There may be two or more tracks, three or more tracks, four three or more tracks, five or more tracks, six or more tracks, seven or more tracks, eight or more tracks, nine or more tracks, ten or more tracks.

The sheets 42 be larger or smaller and may have different aspect ratios. For example, the sheet may have a length of at least 10 mm, at least 20 mm, at least 50 mm or at least 100 mm. The sheet 42 may have a length no more than 100 mm, no more than 200 mm, no more than 500 mm or no more than 1 m. However, in some embodiments, the sheet may have a length of at least 200 mm, at least 500 mm or at least 1 m or at least 2 m. The sheet may have an aspect ratio (width to length) of at least 1:1, at least 1:2, at least 1:5, at least 1:10, at least 1:20, at least 1:50 or at least 1:100. Thus, the connectors 41, 41' can be used to provide a connection over small distances, for example, within a device, or over large distances, for example, across or between rooms.

Figure 14:
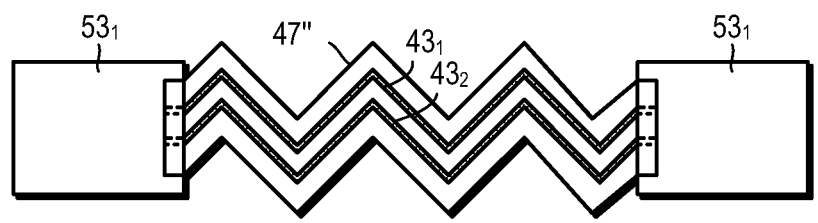
FIG. 14 is a schematic diagram of circuitry in which one or more connectors in accordance with the present invention may be used.

Referring to FIG. 14, a connector 41" similar to the connectors described earlier having one or more tracks $43_1$, $43_2$ can be used to connect two parts $53_1$, $53_2$ of a circuit. In some embodiments, more than one connector can be used to connect the two parts $53_1$, $53_2$ of a circuit.

It will be appreciated that many modifications may be made to the embodiments hereinbefore described.

Card need not be used, but other fibre-based materials, such as paper can be used. Inflexible plastic or even glass can be used. Laminates of, for example card and plastic, can be used.

Although conductive ink can be used, one or more of the conductive regions, such as pads, terminals, tracks etc., can be formed from foil comprising for example, aluminium, copper, gold or aluminium, formed for example, by hot- or cold-foil stamping.

More complex electronic components may be formed, such as microphones and other forms of sensors. Thus, the button may move in response to vibration and the position of the button can be detected capacitively by an underlying conductive pad. The electronic component may be an actuator. An amplifier may be built into, for example, a connector.

The switch, connector and other form of component can be used not only in games, but also books, calendars, greeting cards, product packaging or point of sale displays.

The invention claimed is:

1. An electronic component comprising a flexible planar substrate which is substantially non-stretchable in the plane of the planar substrate, the substrate having at least two slits arranged to allow first and second portions of the substrate lying in the same plane to be moved apart, the first portion of the substrate supporting a region of conductive material, wherein the substrate comprises a fibre-based material, wherein a group of slits are arranged to allow the first portion of the substrate to move out of the plane of the second portion of the substrate and wherein the group of slits comprise at least three separate slits arranged around the first portion of the substrate.

2. An electronic component according to claim 1, wherein the slits are arcuate.

3. An electronic component according to claim 1, wherein each slit overlaps with an adjacent slit to form a bridge between the slits between the first portion of the substrate and the rest of the substrate.

4. An electronic component according to claim 1, wherein the region of conductive material comprises a pad of conductive material lying within the extent of the first portion of the substrate.

5. An electronic component according to claim 4, wherein the pad of conductive material is isolated.

6. An electronic component according to claim 4, wherein the region of conductive material further comprises a conductive track connected to the pad of conductive material extending beyond the first portion of the substrate.

7. An electronic component according to claim 1, wherein the region of conductive material is a first region of conductive material and wherein the electronic component further comprises a second substrate supporting a second region of conductive material arranged to face the first region of conductive material and separated by a given distance such that displacement of the first portion of the substrate by the given distance causes the first and second conductive regions to come into contact.

8. An electronic component according to claim 7, wherein the second substrate further includes a third region of conductive material spaced apart from the second conductive region, the second and third conductive regions arranged to face and overlap with the first conductive region such that displacement of the first portion of the substrate by the given distance causes the second and third conductive regions to be connected.

9. An electronic component according to claim 1, wherein the substrate comprises paper.

10. An electronic component according to claim 1, wherein the substrate comprises card.

11. An electronic component according to claim 1, wherein the substrate comprises a laminate.

12. An electronic component according to claim 1, wherein the conductive material comprises a conductive ink.

13. An article comprising:
a plurality of electronic components according to claim 1, the electronic components sharing the same substrate and the article comprising:
a plurality of groups of slits, each arranged to allow a respective portion of the substrate to move out of the plane of the substrate.

14. An article comprising:
an electrical circuit; and
at least one electronic component according to claim 1, wherein the region of conductive material forms part of the electrical circuit.

15. An article according to claim 14, wherein the article is a game.

16. An article according to claim 14, wherein the article is a greetings card.

* * * * *